United States Patent
Iimura (10) Patent No.: US 11,311,880 B2
(45) Date of Patent: Apr. 26, 2022

(54) MICROCHIP CONTROLLING SYSTEM

(71) Applicant: NEC CORPORATION, Tokyo (JP)

(72) Inventor: Yasuo Iimura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 132 days.

(21) Appl. No.: 16/496,762

(22) PCT Filed: Mar. 27, 2018

(86) PCT No.: PCT/JP2018/012511
§ 371 (c)(1),
(2) Date: Sep. 23, 2019

(87) PCT Pub. No.: WO2018/181360
PCT Pub. Date: Oct. 4, 2018

(65) Prior Publication Data
US 2020/0030801 A1  Jan. 30, 2020

(30) Foreign Application Priority Data

Mar. 28, 2017  (JP) ............................. JP2017-062285

(51) Int. Cl.
*B01L 3/00* (2006.01)
*F16K 99/00* (2006.01)
*G01N 35/08* (2006.01)

(52) U.S. Cl.
CPC ... *B01L 3/502746* (2013.01); *B01L 3/502738* (2013.01); *B01L 3/567* (2013.01);
(Continued)

(58) Field of Classification Search
CPC ......... B01L 3/502746; B01L 3/502738; B01L 3/567; B01L 2300/0877; B01L 2300/123; B01L 2400/0487; B01L 2300/14; B01L 2300/0887; F16K 99/0015; F16K 2099/0084; F16K 99/0042; F16K 99/0059; G01N 35/08; G01N 35/1097; G01N 2035/00158; B81B 3/00
See application file for complete search history.

(56) References Cited

U.S. PATENT DOCUMENTS

| 8,147,774 B2 | 4/2012 | Hagiwara et al. |
| 10,029,255 B2 | 7/2018 | Kitamoto |

(Continued)

FOREIGN PATENT DOCUMENTS

| JP | 2002-228033 A |   | 8/2002 |
| JP | 2002228033 A | * | 8/2002 |

(Continued)

OTHER PUBLICATIONS

International Search Report for PCT/JP2018/012511 dated Jun. 26, 2018 (PCT/ISA/210).

*Primary Examiner* — Jennifer Wecker
*Assistant Examiner* — Oyeleye Alexander Alabi
(74) *Attorney, Agent, or Firm* — Sughrue Mion, PLLC (57) ABSTRACT

A microchip controlling system comprises a microchip which is configured by adhesion of an elastic sheet and a plate/sheet member, and on which a flow path is provided as an inadhesive section between the elastic sheet and the plate/sheet member; and a microchip controlling apparatus comprising a valve mechanism which is inflated or deflated so as to control the flow path to be opened or closed.

2 Claims, 11 Drawing Sheets

(52) U.S. Cl.
CPC ......... *F16K 99/0015* (2013.01); *G01N 35/08* (2013.01); *B01L 2300/0877* (2013.01); *B01L 2300/123* (2013.01); *B01L 2400/0487* (2013.01); *B01L 2400/0666* (2013.01)

(56) References Cited

U.S. PATENT DOCUMENTS

| | | |
|---|---|---|
| 10,195,607 B2 | 2/2019 | Asogawa et al. |
| 2009/0202391 A1 | 8/2009 | Hagiwara et al. |
| 2010/0166609 A1 | 7/2010 | Hagiwara et al. |
| 2016/0288119 A1 | 10/2016 | Asogawa et al. |
| 2017/0106369 A1 | 4/2017 | Asogawa et al. |
| 2017/0173583 A1 | 6/2017 | Kitamoto |

FOREIGN PATENT DOCUMENTS

| | | |
|---|---|---|
| JP | 2010-151717 A | 7/2010 |
| WO | 2008/004572 A1 | 1/2008 |
| WO | 2014/148265 A1 | 9/2014 |
| WO | 2015/119290 A1 | 8/2015 |
| WO | 2015/141790 A1 | 9/2015 |

\* cited by examiner

MICROCHIP CONTROLLING SYSTEM

CROSS-REFERENCE TO RELATED APPLICATION

This application is a National Stage of International Application No. PCT/JP2018/012511 filed Mar. 27, 2018 and claims benefits of priority of Japanese Patent Application 2017-062285 filed in Japan on Mar. 28, 2017, the entire contents thereof are incorporated by reference into the present application.

FIELD

The present invention relates to a microchip controlling system. Particularly, the present invention relates to a microchip controlling system for controlling biochemical reaction executed on a microchip.

BACKGROUND

A technology for automatically executing a biochemical reaction on a microchip has been developed. For example, Patent Literature (PTL) 1 discloses a microchip comprising reaction chambers for extraction of DNA (deoxyribonucleic acid), PCR (polymerase chain reaction) and the like, and valve mechanisms for opening and closing flow paths connected to the reaction chambers.

PTL: International application publication WO 2014/148265A1

SUMMARY

Analysis described below is made according to a view of the present invention. Herein, the Patent Literature above is incorporated in this application by reference thereto.

The microchip disclosed in Patent Literature 1 requires an expensive production cost, since the reaction chambers and the valve mechanism precisely should be constructed accurately. However, the microchip itself must be disposed after use, since substances which cannot be reused, such as magnetic beads, are enclosed in the microchip.

Therefore, it is a purpose of the present invention to provide a microchip controlling system with which production cost for a microchip may be reduced.

According to a first aspect of the present invention, there is provided a microchip controlling system comprising:

a microchip which is configured by adhesion of an elastic sheet and a plate or sheet member, and on which a flow path is provided as an inadhesive section between the elastic sheet and the plate or sheet member; and a microchip controlling apparatus comprising a valve mechanism which is inflated or deflated so as to control the flow path to be opened or closed.

According to the first aspect of the present invention, there is provided a microchip controlling system contributing to reduction production cost of a microchip.

PREFERRED MODES

A preferable exemplary embodiment of the present invention will be explained in detail with reference to drawings. Herein, symbols in the following description are expediently attached to each element as an explanatory aid for understanding, but not for limitation of the present invention to an illustrated configuration. In addition, a connection line between blocks in each figure indicates both of bidirection and single direction. One way arrow schematically shows main signal (data) flow, but not excluding bidirection.

Figure 1A:
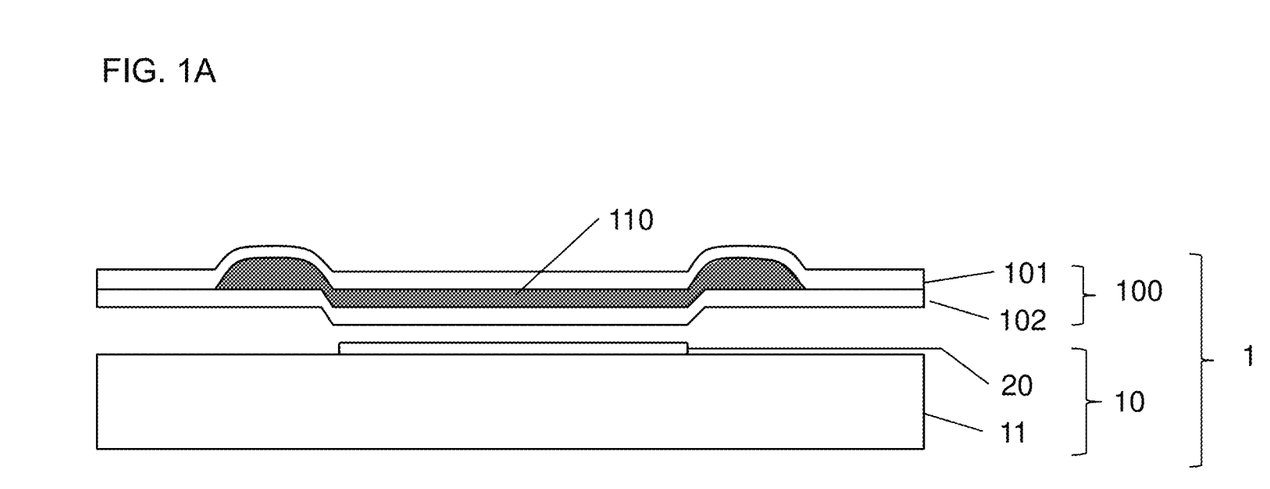
FIGS. 1A-1B are explanatory views of a summary of a microchip controlling system 1 of an exemplary embodiment.
Figure 1B:
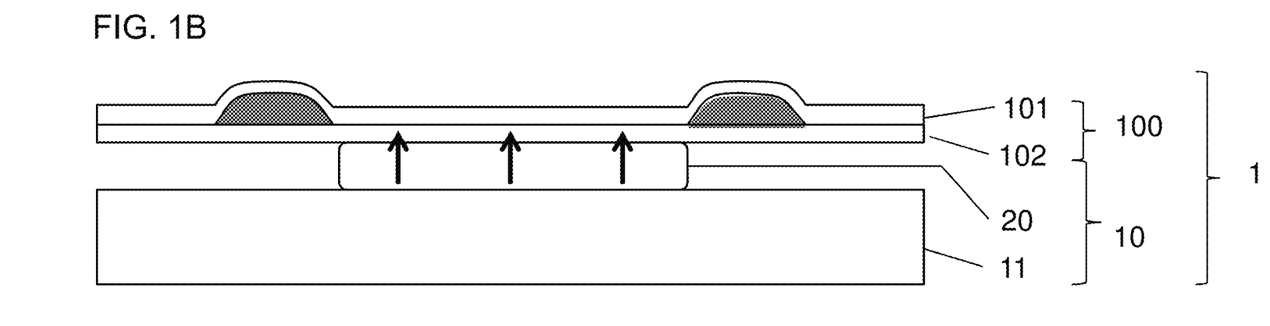

FIG. 1 is an explanatory view of an outline of a microchip controlling system 1 of one exemplary embodiment. As shown in FIG. 1, the microchip controlling system 1 has a configuration comprising a microchip controlling apparatus 10 and a microchip 100. The microchip 100 is configured by adhesion of an elastic sheet and a plate/sheet member. For example, as shown in FIG. 1, it is configured by adhesion of a plurality of elastic sheets 101, 102, in which a flow path 110 is provided as an inadhesive section between the elastic sheets 101, 102. A valve mechanism 20 is provided on the microchip controlling apparatus 10, which is inflated or deflated so as to control the flow path to be opened or closed. Concretely, the valve mechanism 20 is provided on a base member (or substrate) 11 of the microchip controlling apparatus 10 so as to be directed (i.e. opposing) to the flow path 110.

Under a state illustrated in FIG. 1A, the valve mechanism 20 is deflated, thus the elastic sheet 102 may be warped toward the valve mechanism 20. Due to such warping, the inadhesive section between the elastic sheets 101, 102 is vertically expanded so as to form the flow path 110. That is, the state illustrated in FIG. 1A indicates an "opened flow path" state.

Under a state illustrated in FIG. 1B, the valve mechanism 20 is inflated, and pushes the elastic sheet 102 up so that the elastic sheet 102 contacts to the elastic sheet 101. Under such state, the inadhesive section between the elastic sheets 101, 102 is squashed, thus the flow path 110 may not be formed. [translation annotation: the term "squashed" means a state where a gap space as the inadhesive section (i.e. flow path) is narrowed (compressed) to zero in vertical direction] That is, the state illustrated in FIG. 1B indicates a "closed flow path" state.

In the microchip controlling system above, the disposable parts are only elastic sheets 101, 102. That is, the valve mechanism 20 may be reused, thus production cost of the microchip 100 itself is reduced.

A preferable exemplary embodiment of the present invention will be explained below in detail with reference to drawings. Herein, symbols in the following description are expediently attached to each element as an explanatory aid for understanding, but not for limitation of the present invention to an illustrated configuration. In addition, the symbols may be attached or deleted appropriately for clarity purpose.

First Exemplary Embodiment

Figure 2:
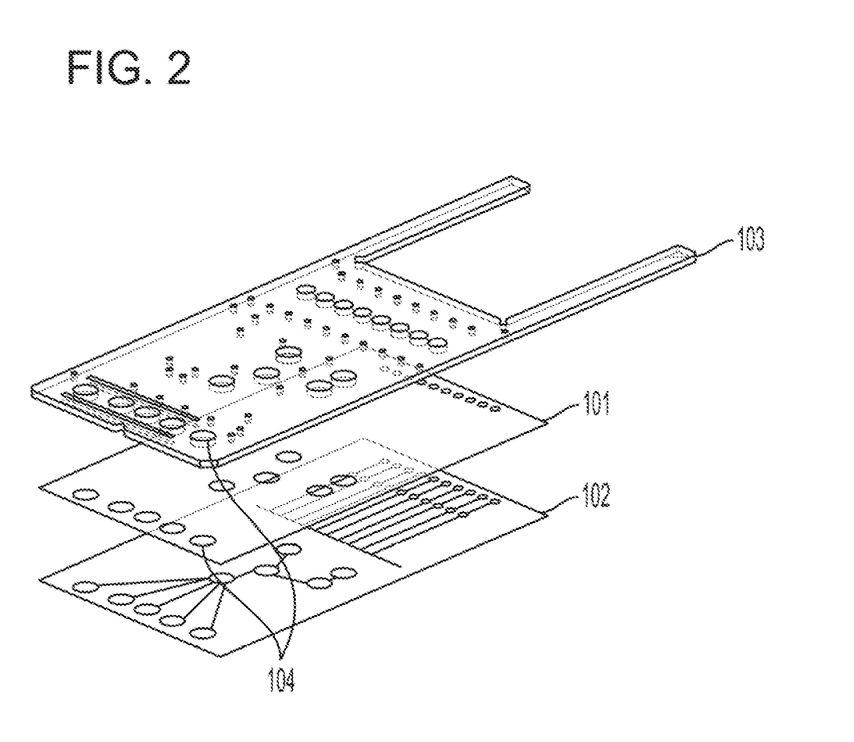
FIG. 2 is an exemplary view of a microchip 100 of a first exemplary embodiment.

A microchip 100 is configured by attachment of elastic sheets 101, 102 and a resin plate 103 one another. In one concrete example, the microchip 100 may be disassembled as illustrated in FIG. 2. That is, the microchip 100 is so constructed that the elastic sheet 101 is attached onto the elastic sheet 102 and then the resin plate 103 is attached onto the elastic sheet 101. Approximately circular parts and line parts on the elastic sheet 102 shown in FIG. 2 indicate inadhesive sections corresponding to parts to be reaction chambers 120 and flow paths 110 respectively. Herein, in the present application, the term "reaction chamber 120" involves a reagent chamber for injection of reaction reagent, etc. The elastic sheet 101 and the resin plate 103 are provided with through holes 104 in a manner matching with function of the reaction chamber 120.

Figure 3:
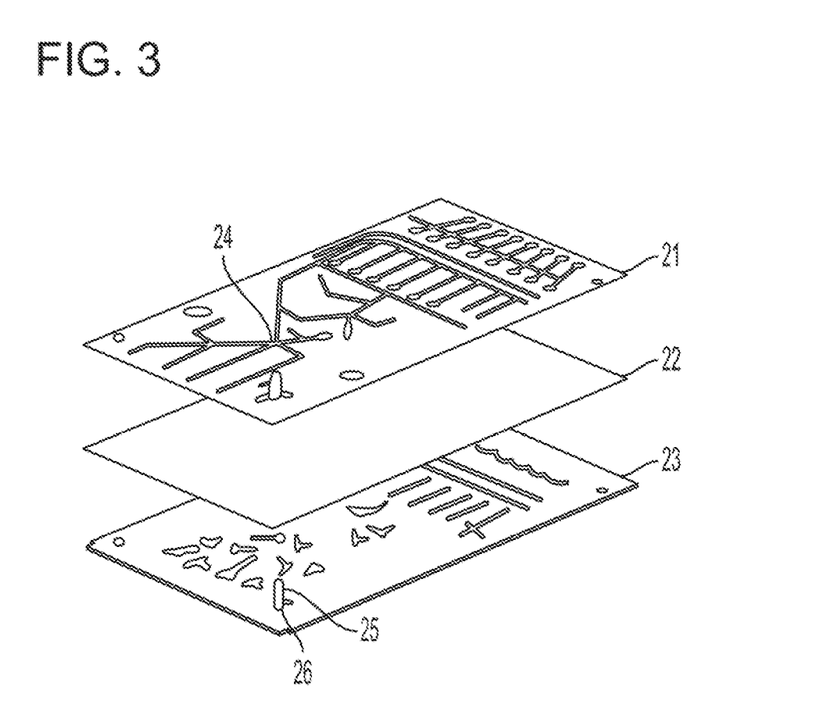
FIG. 3 is an exemplary view of a valve mechanism 20 of the first exemplary embodiment.

The valve mechanism 20 comprises at least two plates and one elastic sheet interposed between the plates. In one concrete example, the valve mechanism 20 may be disassambed as illustrated in FIG. 3. That is, the valve mechanism 20 is so constructed that an elastic sheet 22 is attached onto a resin plate 23 and then a resin plate 21 is attached onto the elastic sheet 22. Herein, the resin plate 21 may be referred to as a "first plate" and the resin plate 23 may be referred to as a "second plate". As shown in FIG. 3, the resin plate 21 comprises at least a cut out section 24 at a position to be directed to the flow path 110 on the microchip 100. The resin plate 23 comprises a groove section 25 and a hole part 26. The groove section 25 is provided at a position corresponding to the cut out section 24 on a surface of the resin plate 23 to be directed to the elastic sheet 22. The hole part 26 is connected to the groove section 25 via a side path and also connected to a solenoid valve 32. The solenoid valve 32 injects/releases a pressurizing medium, such as compressed air, into/from the groove section 25 through the hole part 26. In a state where the pressurizing medium is injected into the valve mechanism 20 through the solenoid valve 32, the flow path 110 on the microchip 100 is brought into a closed state. In a state where the pressurizing medium is released from the valve mechanism 20 through the solenoid valve 32, the flow path 110 on the microchip 100 is brought into an opened state.

Figure 4A:
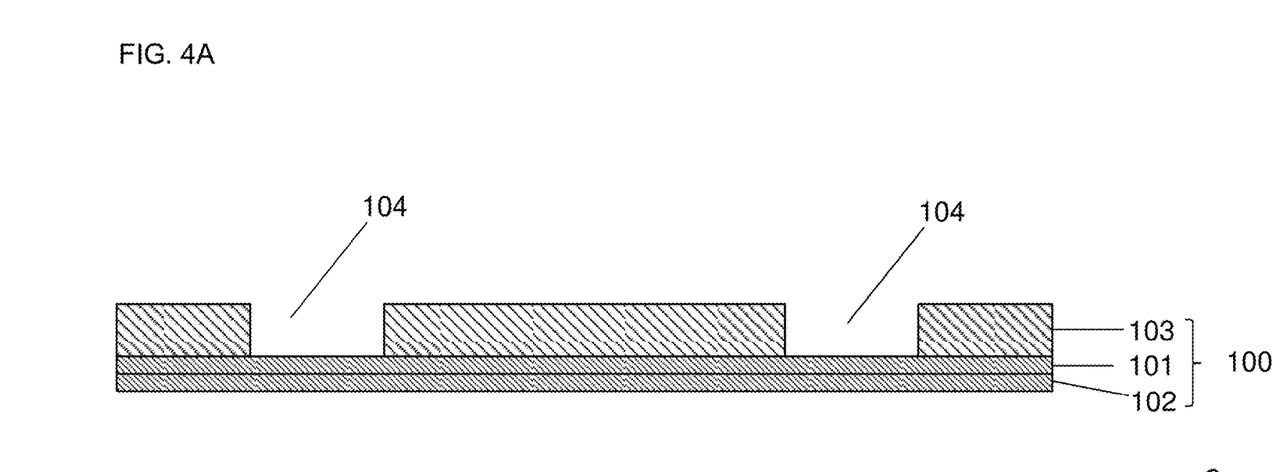
FIGS. 4A-4B are conceptual views of one configuration of a microchip controlling system 1 of the first exemplary embodiment.
Figure 4B:
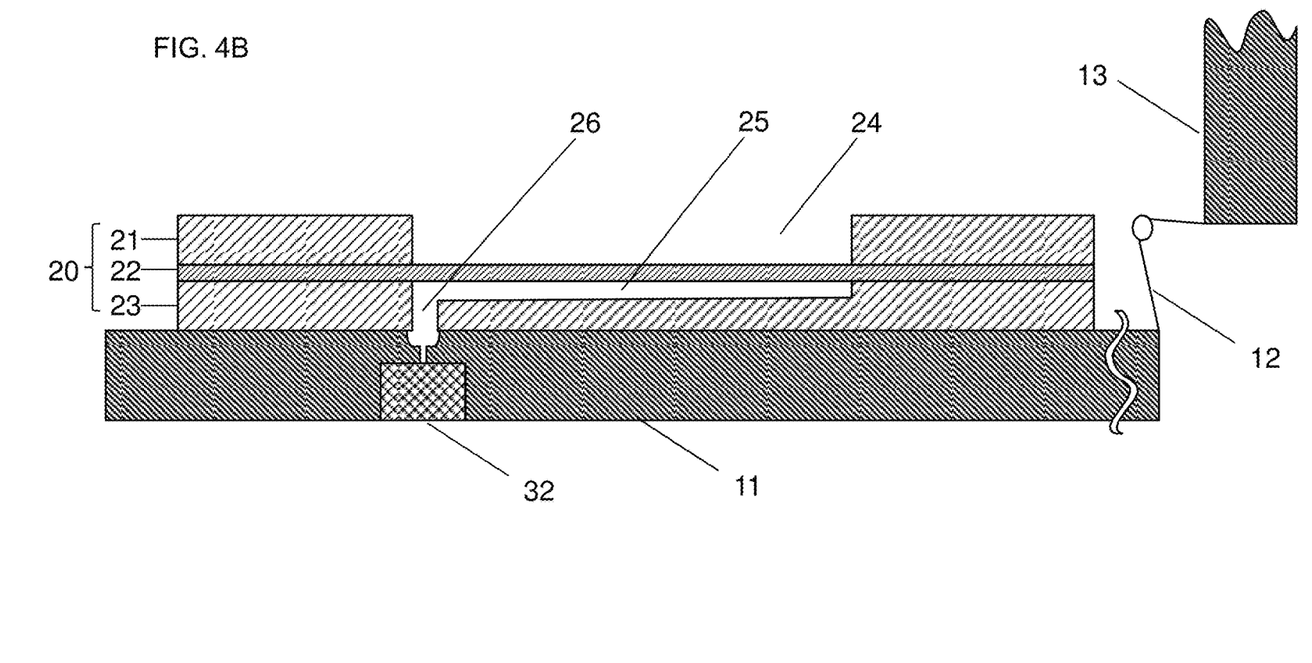

A flow path control on the microchip 100 will be explained below. FIG. 4 is a conceptual view of one configuration of a microchip controlling system. FIG. 4A is a sectional view of the microchip 100 which has not been placed on a microchip controlling apparatus 10 and FIG. 4B is a sectional view of the microchip controlling apparatus 10 on which the microchip 100 has not been placed. Like as FIG. 2, the microchip 100 comprises the elastic sheets 101, 102 and the resin plate 103 provided with through holes 104. In addition, like as FIG. 3, the valve mechanism 20 comprises the resin plate 21 provided with a cut out section 24, the elastic sheet 22 and the resin plate 23 provided with the groove section 25 and the valve mechanism 20 is fixed on a base member 11 of the microchip controlling apparatus 10. The hole part 26 of the valve mechanism 20 is connected to the solenoid valve 32 mounted on the base member 11. The base member 11 is connected to a lid (cover plate) 13 via a hinge 12.

FIG. 5 is an explanatory view of flow path control on the microchip 100. As illustrated in FIG. 5A, the microchip 100 is placed on the valve mechanism 20 and pressed onto the valve mechanism 20 by the lid 13. The position of the microchip 100 and the valve mechanism 20 is adjusted in a manner, for example, a pin is inserted into a pinhole, which are provided respectively. In addition, the microchip 100 is pressed onto the valve mechanism 20, for example, with a spring member provided on the lid 13. The lid 13 is provided with pressurizing holes 14 through which the pressurizing medium may be injected into/released from the through holes 104 on the microchip 100. As illustrated in FIG. 5B, at a space as the through hole 104 on the microchip 100 a reaction chamber 120 is formed due to injection of liquid into the inadhesive section. Starting from a state illustrated in FIG. 5B, when the pressurizing medium is injected into the through hole 104 so as to press the reaction chamber 120, the liquid in the reaction chamber 120 pushes the elastic sheet 102 down into the cut out sections 24 on the valve mechanism 20 while forming the flow path 110 as illustrated in FIG. 5C. Then, as illustrated in FIG. 5D, the liquid flowing through the flow path 110 reaches a section at another through hole 104 and forms a new reaction chamber 120. Under such state, when the pressurizing medium is injected into the groove section 25 on the valve mechanism 20 through the solenoid valve 32, the elastic sheet 22 of the valve mechanism 20 is upwardly pushed and the elastic sheets 101, 102 of the microchip 100 is brought into contact each other as illustrated in FIG. 5E. Finally, as illustrated in FIG. 5F, the flow path 110 is squashed and brought into a closed state.

Figure 5A:
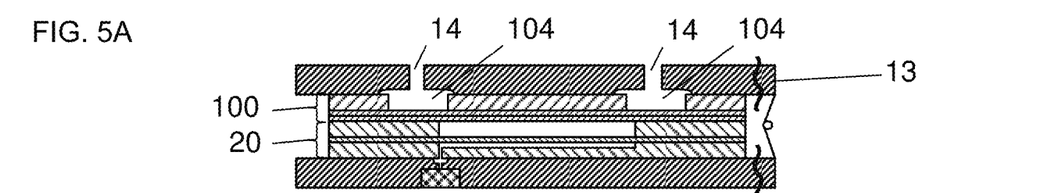
FIGS. 5A-5F are explanatory views of flow path control on the microchip 100 of the first exemplary embodiment.
Figure 5B:
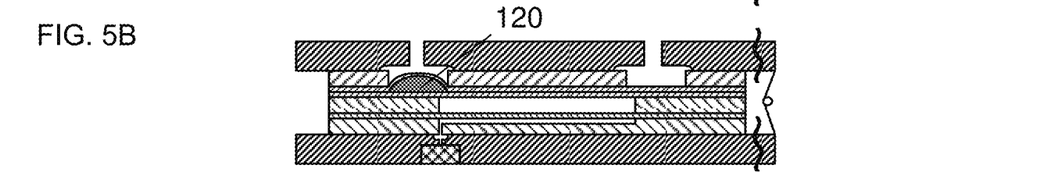
Figure 5C:
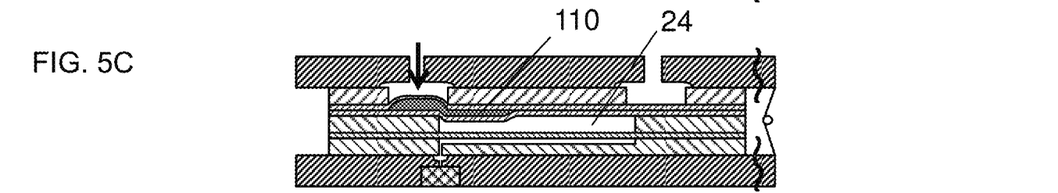
Figure 5D:
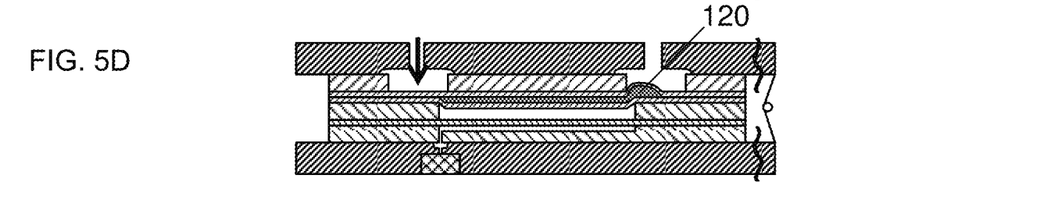
Figure 5E:
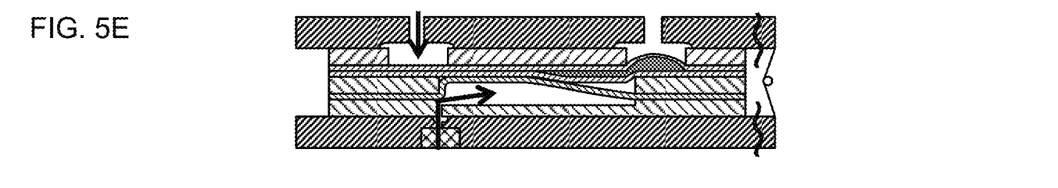
Figure 5F:
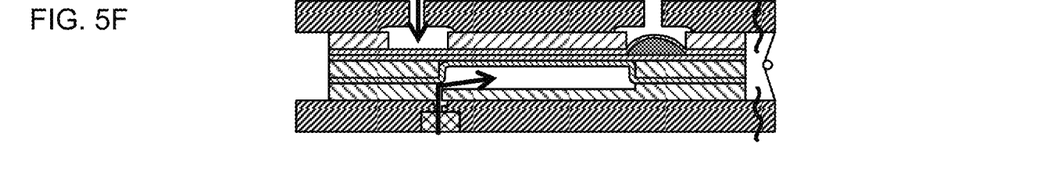

The explanation above would be described with another expression as follows. Under the state from FIG. 5A to FIG. 5D, the groove section 25 on the valve mechanism 20 is deflated, thus it is an "opened state" where the elastic sheet 102 on the microchip 100 enters the cut out sections 24 to form the flow path. When the pressurizing medium is injected into the groove section 25 of the valve mechanism 20, as illustrated in FIGS. 5E, F, the elastic sheet 22 is shoved into the cut out section 24 and the elastic sheet 102 is pushed out from the cut out section 24. As a result, the flow path 110 on the microchip 100 is squashed and brought into the "closed state". That is, close/open of the flow path 110 on the microchip 100 is controlled by expansion or contraction of the groove section 25 on the valve mechanism 20.

Figure 6:
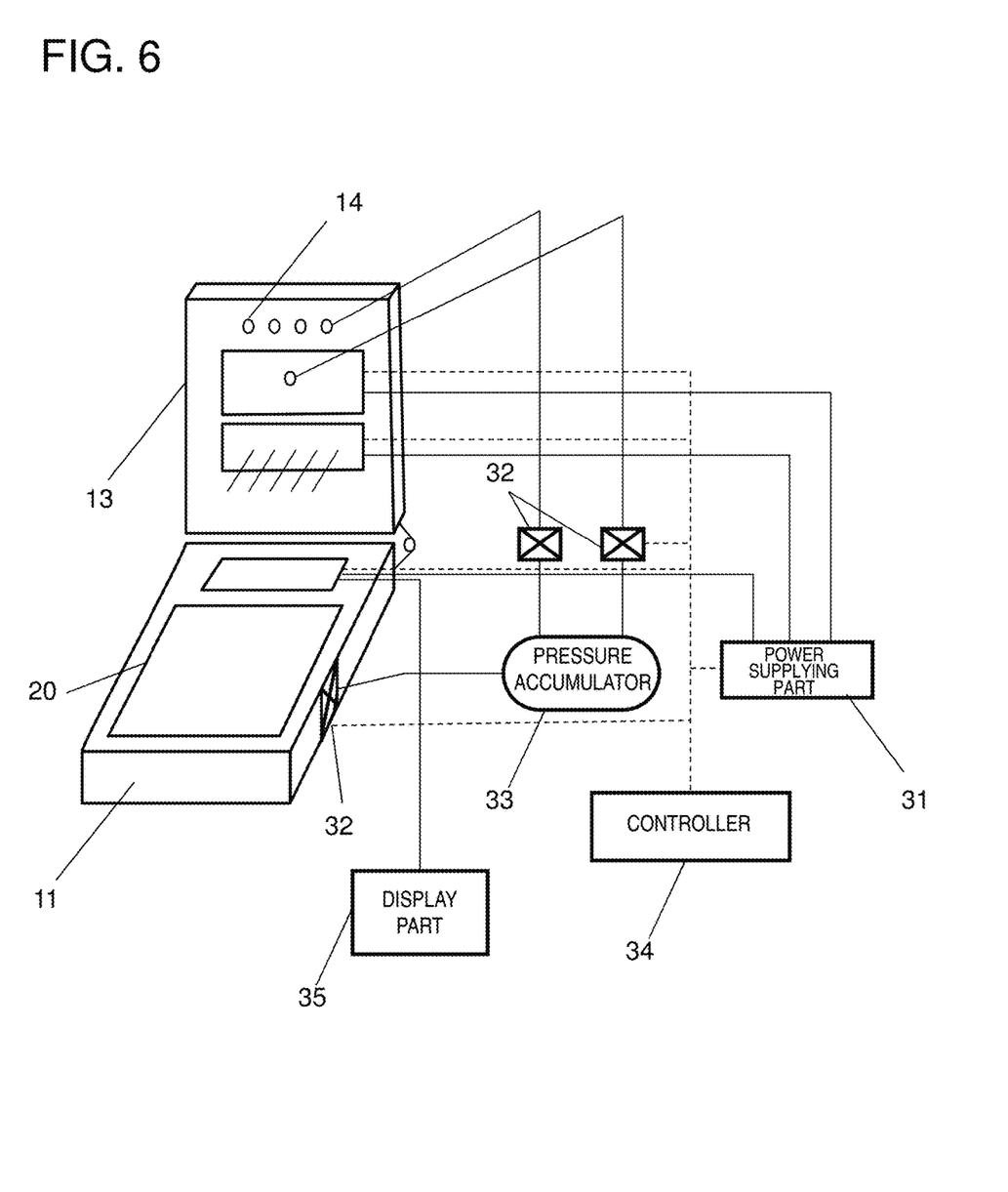
FIG. 6 is a view illustrating one configuration of the microchip controlling apparatus 10 of the first exemplary embodiment.

As illustrated in FIG. 6, entire microchip controlling apparatus 10 comprises the base member 11, the lid 13, a power supplying part 31, the solenoid valve 32, a pressure accumulator 33, a controller 34, and a display part 35. Like as FIG. 4, the valve mechanism 20 is fixed on the base member 11 and the solenoid valve 32 is mounted on the base member 11. Furthermore, an electrophoresis unit etc. are mounted on the base member 11.

Like as FIG. 5, the lid 13 connected to the base member 11 with a hinge 12 is provided with the pressurizing holes 14. Furthermore, the lid 13 is provided with a DNA extracting unit, a PCR unit etc. The power supplying part 31 supplies electric power to each unit under control by the controller 34. In addition, a solenoid valve 32 is embedded in the base member 11 and another solenoid valve 32 is connected to the pressurizing holes 14 on the lid 13. Both of them are of a purpose of switching injection/release of the pressurizing medium supplied from the pressure accumulator 33 under control by the controller 34. The controller 34 controls each of the units, the solenoid valve 32 and the like so as to execute biochemical reaction, flow path control, electrophoresis on the microchip 100. The display part 35 display an electrophoresis result obtained by the electrophoresis unit.

Herein, configurations of the microchip 100 and the microchip controlling apparatus 10 are similar to those disclosed in an international application publication WO2014/148265 (Patent Literature 1), except for the valve mechanism 20. Briefly, for example, the DNA extracting unit is an electromagnet etc. which holds magnetism beads enclosed in the microchip 100. The PCR unit comprises a temperature sensor, a heat conductor, a Peltier element (thermoelectric element), a heat releasing plate and the like and functions as a thermal cycler. The electrophoresis unit comprises an electrode, a laser, a camera and the like, and executes capillary electrophoresis. Herein, the electrophoresis mechanism, such as a capillary, is fitted on a notched part of the resin plate 103 shown in FIG. 2.

In the microchip controlling system stated above, the valve mechanism 20 is mounted on the microchip controlling apparatus 10 and used repeatedly. Therefore, production cost of the microchip 100 itself may be reduced.

Second Exemplary Embodiment

Figure 7:
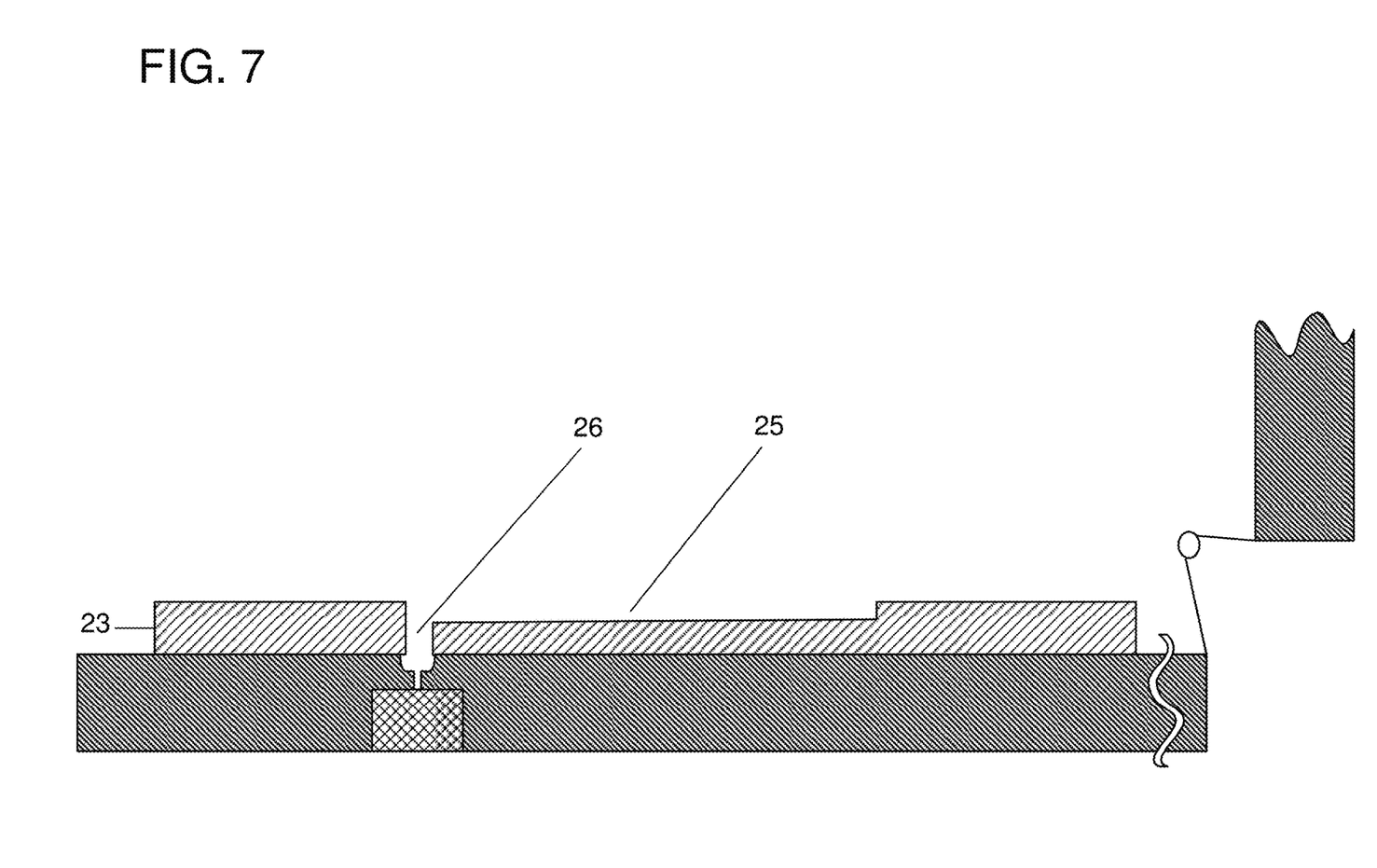
FIG. 7 is a conceptual view of one configuration of a microchip controlling system 1 of a second exemplary embodiment.

The valve mechanism 20 may be configured with the resin plate 23 only. Concretely, as illustrated in FIG. 7, the valve mechanism 20 comprises a resin plate 23 having a groove section 25 and a hole part 26. The groove section 25 is arranged at a position to be directed to the flow path 110.

Figure 8A:
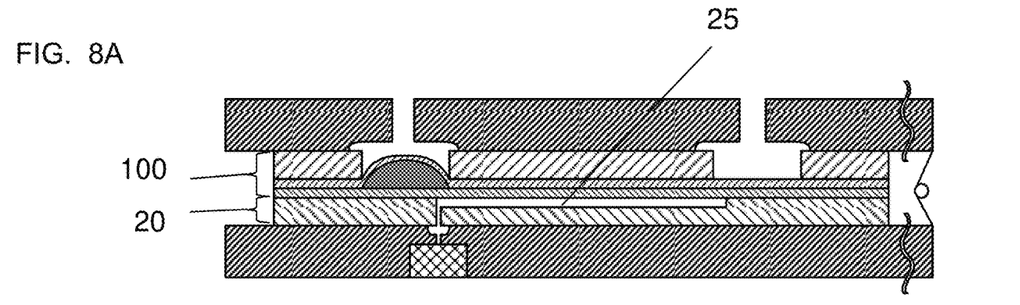
FIGS. 8A-8C are explanatory views of flow path control on a microchip 100 of the second exemplary embodiment.
Figure 8B:
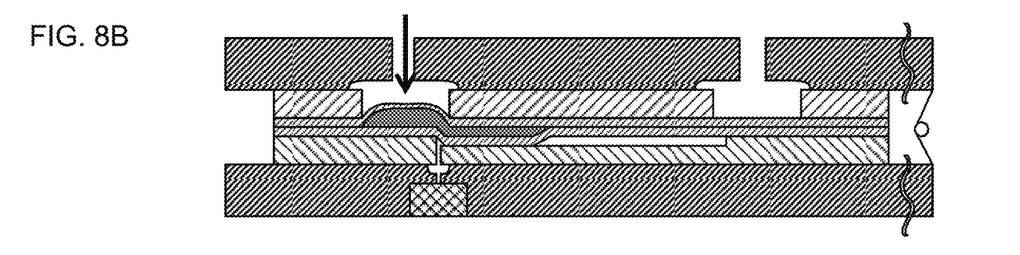
Figure 8C:
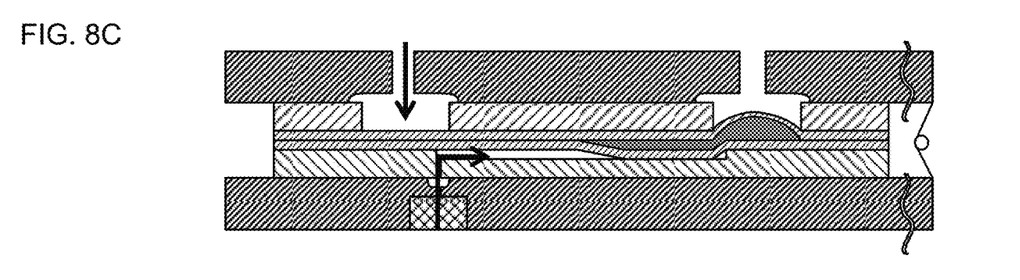

As illustrated in FIG. 8A, the microchip 100 of the second exemplary embodiment is placed on the resin plate 23 of the valve mechanism 20. Starting from a state illustrated in FIG. 8A, when the pressurizing medium is injected into the through hole 104, liquid in a reaction chamber 120 pushes an elastic sheet 102 down into a groove section 25 on the valve mechanism 20 while forming a flow path 110 as illustrated in FIG. 8B. After that, when the pressurizing medium is injected into the groove section 25 of the valve mechanism 20, the elastic sheet 102 of the microchip 100 is upwardly pushed and the elastic sheets 101, 102 are brought into contact each other as illustrated in FIG. 8C.

The explanation for FIG. 8 would be described with another expression as follows. When the elastic sheet 102 of the microchip 100 enters the groove section 25, the flow path 110 is brought into an opened state. When the elastic sheet 102 of the microchip 100 is pushed out from groove section 25 due to injection of the pressurizing medium, the flow path 110 is brought into a closed state. As stated above, the valve mechanism 20 may be configured more simply.

Third Exemplary Embodiment

A part to be inflated or deflated in the valve mechanism 20 may be configured as an inadhesive section between the elastic sheets similarly to the flow path 110 of the microchip 100. In such exemplary embodiment, the valve mechanism 20 is provided with a valve part 27 to be directed to the flow path 110 and a side path section 28 as an inadhesive section for injection of pressurizing medium into the valve part 27.

Figures 9A, 9B:
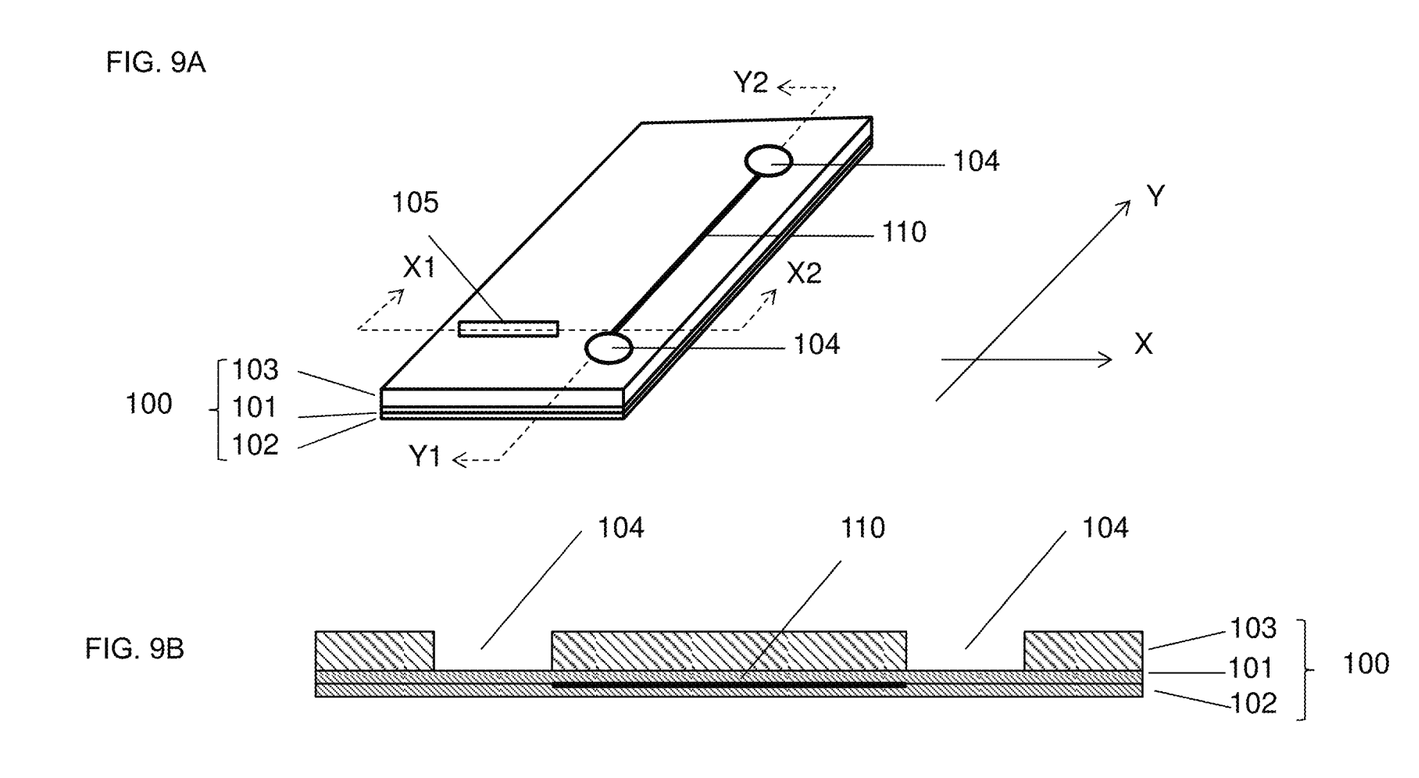
FIGS. 9A-9C are conceptual views of one configuration of a microchip 100 of a third exemplary embodiment.
Figure 9C:
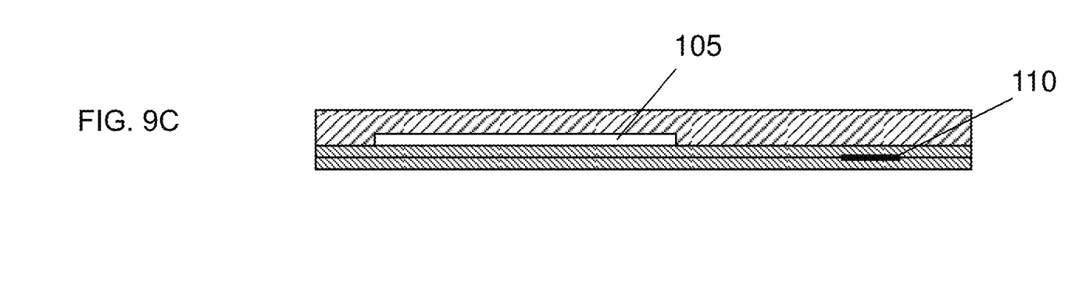

In a perspective view of the microchip 100 while focusing on the configuration thereof, as illustrated in FIG. 9A, the resin plate 103 of the microchip 100 is provided with a groove section 105 at a position apart from the flow path 110. In a Y1-Y2 cross-sectional view of FIG. 9A, the microchip 100 is illustrated as FIG. 9B. In a X1-X2 cross-sectional view, the microchip 100 is illustrated as FIG. 9C. That is, a part destined to be a flow path 110 is provided as inadhesive section between the elastic sheets 101, 102. In addition, the resin plate 103 is provided with a through hole 104 and a groove section 105 is provided on a surface of the resin plate 103 directed to the elastic sheet 101. Herein, in FIG. 9, the inadhesive section to be the flow path 110 is illustrated with a bold line.

Figure 10A:
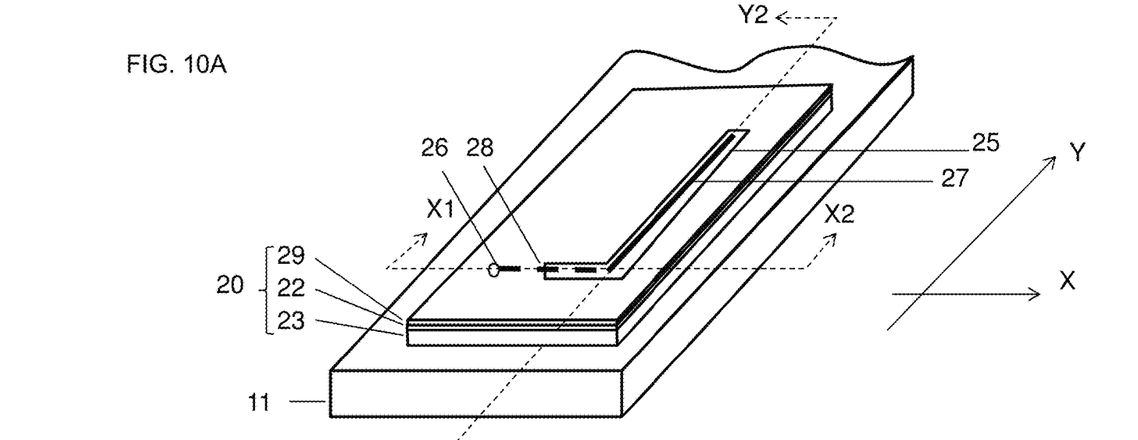
FIGS. 10A-10C are conceptual views of one configuration of a microchip controlling apparatus 10 of the third exemplary embodiment.
Figure 10B:
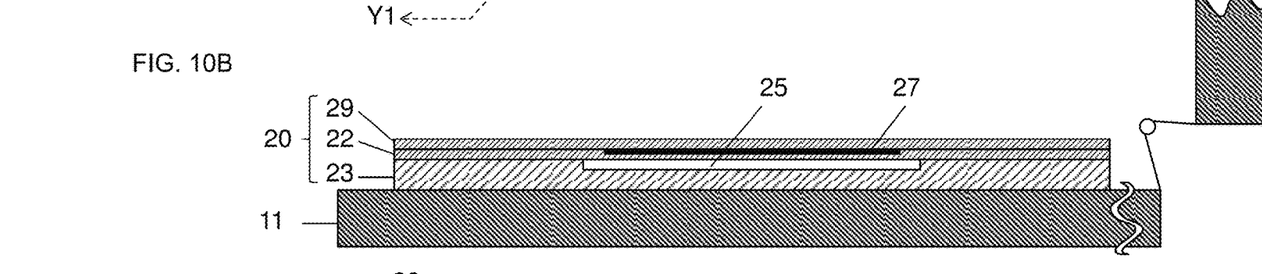
Figure 10C:
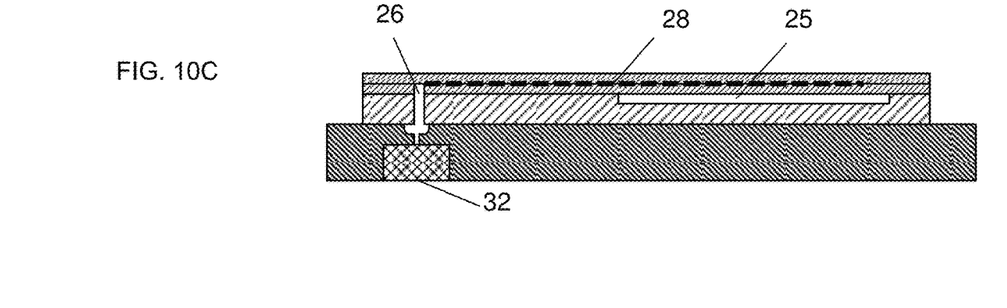
Figure 11A:
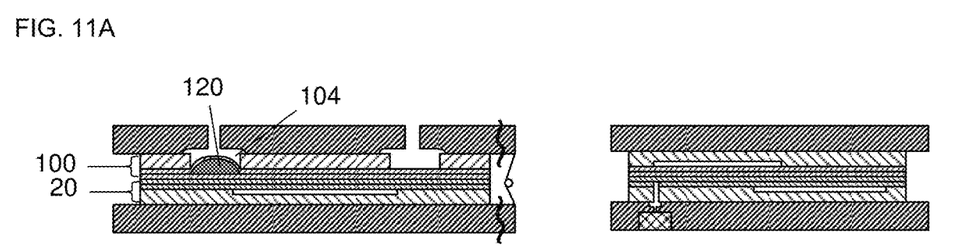
FIGS. 11A-11E are explanatory views of flow path control on the microchip 100 of the third exemplary embodiment.
Figure 11B:
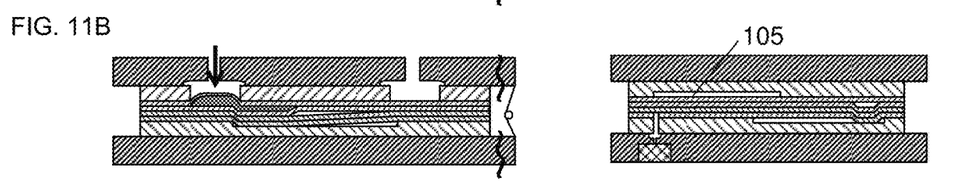
Figure 11C:
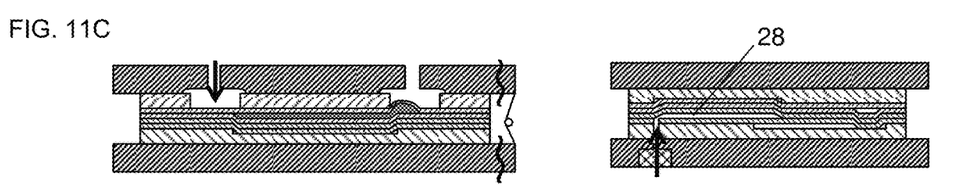
Figure 11D:
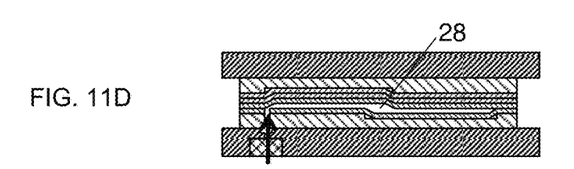
Figure 11E:
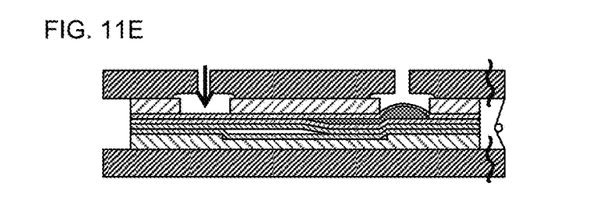

In a perspective view while focusing on the configuration of the valve mechanism 20, as shown in FIG. 10A, the valve mechanism 20 has a configuration where an elastic sheet 22 is attached onto a resin plate 23 and an elastic sheet 29 is attached onto the elastic sheet 22. The valve part 27 and the side path section 28 are provided as inadhesive sections (chambers) between the elastic sheet 22 and the elastic sheet 29. The resin plate 23 is provided with a groove section 25 and a hole part 26. In a Y1-Y2 cross-sectional view of FIG. 10A, the valve mechanism 20 is illustrated as FIG. 10B. In a X1-X2 cross-sectional view of FIG. 10A, the valve mechanism 20 is illustrated as FIG. 10C. That is, the valve part 27 is provided in a manner directed (assigned) to the flow path 110 of the microchip 100. The side path section 28 is provided in a manner where a part of the side path section 28 overlaps with the groove section 105 of the microchip 100 and the side path section 28 is connected with the valve part 27 and the hole part 26. The hole part 26 is provided in a manner penetrating the elastic sheet 22 and the resin plate 23 and connected with the side path section 28 and the solenoid valve 32. The groove section 25 is provided in a manner covering a part of the side path section 28 and the valve part 27. The side path section 28 overlaps with the groove section 105 at a one section. In FIG. 10, the inadhesive section destined to be the valve part 27 is indicated by a bold solid line and the inadhesive section to be the side path section 28 is indicated by a bold broken line.

FIG. 11 is an explanatory view of a flow path control on the microchip 100. Right and left panels in FIG. 11 represent a state at the same time point. The left panels indicate a side sectional view of the microchip controlling system 1 (corresponding to FIG. 9B and FIG. 10B) and the right side panels indicate a front sectional view of the microchip controlling system 1 (corresponding to FIG. 9C and FIG. 10C). As illustrated in FIG. 11A, the microchip 100 is placed on the valve mechanism 20, where a reaction chamber 120 is formed by injection of a liquid into an inadhesive section of the microchip 100. Starting from the state illustrated in FIG. 11A, when a pressurizing medium is injected into the through hole 104, the liquid in the reaction chamber 120 presses elastic sheets 22, 29, 102 down into the groove section 25 of the valve mechanism 20 while forming the flow path 110 as illustrated in FIG. 11B. Then, as illustrated in FIG. 11C, when the pressurizing medium is injected into the hole part 26 via the solenoid valve 32, the elastic sheets 29, 101, 102 are upwardly pushed into the groove section 105 on the microchip 100 so as to form the side path section 28. After the side path section 28 reaches an overlapping section of the groove section 105 on the microchip 100 and the groove section 25 on the valve mechanism 20, the side path section 28 is extended while pressing the elastic sheet 22 down into the groove section 25 as illustrated in FIG. 11D. After the side path section 28 reaches an overlapping section with the flow path 110, the elastic sheets 29, 102 are upwardly pushed so as to form the valve part 27 as illustrated in FIG. 11E. At a section where the valve part 27 is formed, the elastic sheets 101, 102 are brought into contact, thus the flow path 110 on the microchip 100 is squashed to be a closed state.

The explanation for FIG. 11 would be described with another expression as follows. The elastic sheet 102 squashes the valve part 27 in the groove section 25 of the valve mechanism 20 so that the flow path 110 on the microchip 100 is brought into an opened state. In addition, the valve part 27 is inflated by injection of pressurizing medium so that the flow path 110 is brought into a closed state. The elastic sheet 101 of the microchip 100 is shoved into the groove section 105 on the microchip 100 due to injection of pressurizing medium so as to form a partial section of the side path section 28. As described above, a section of the valve mechanism 20 to be inflated/deflated, i.e. the valve part 27, may be configured as an inadhesive section between the elastic sheets 22, 29.

Other modified modes will be explained below. The microchip 100 may be configured with the elastic sheet 101 and the resin plate 103. That is, the flow path 110 on the microchip 100 may be configured as an inadhesive section (channel) between the elastic sheet 101 and the resin plate 103. In such case, the elastic sheet 101 would contact to the resin plate 103 more easily, if the aspect ratio of the flow path (i.e. height/width) is reduced or the flow path is configured to have no corner (designed in a round shape). In such case, the resin plate 103 corresponds to a plate-shaped member.

The pressurizing medium may be injected/released from a side of the lid 13. For example, in the first exemplary embodiment illustrated in FIG. 4 and FIG. 5, the hole part 26 may be provided in a manner penetrating the resin plates 21, 103 and the elastic sheets 22, 101, 102, and a side path section 28 may be provided on the resin plate 23 so as to communicate the hole part 26 with the groove section 25.

A part or entire of the exemplary embodiments above may be described as follows, but no to be limited thereto.

(Mode 1)

A microchip controlling system comprising:

a microchip which is configured by adhesion of an elastic sheet and a plate/sheet member, and on which a flow path is provided as an inadhesive section between the elastic sheet and the plate/sheet member; and a microchip controlling apparatus comprising a valve mechanism which is inflated or deflated so as to control the flow path to be opened or closed.

(Mode 2)

The microchip controlling system of Mode 1, wherein the valve mechanism is configured with at least two plates and an elastic sheet sandwiched by the plates, a first plate has a cut out section at a position to be directed to the flow path, a second plate has a groove section at a position corresponding to the cut out section, the flow path is brought into an opened state when the elastic sheet of the microchip enters the cut out section, the flow path is brought into a closed state when the elastic sheet of the valve mechanism is shoved into the cut out section due to expansion of the groove section by injection of pressurizing medium and pushes out the elastic sheet of the microchip from the cut out section.

(Mode 3)

The microchip controlling system of Mode 1, wherein the valve mechanism comprises a plate having a groove section at a position to be directed to the flow path, the flow path is brought into an opened state when the elastic sheet of the microchip enters the groove section, and brought into a closed state when the elastic sheet of the microchip is pushed out from the groove section due to injection of a pressurizing medium.

(Mode 4)

The microchip controlling system of Mode 1, wherein the valve mechanism comprises two elastic sheets having an inadhesive section at a position to be directed to the flow path and a plate having a groove section provided to cover the inadhesive section, and the flow path is brought into an opened state when an elastic sheet of the microchip squashes the inadhesive section of the valve mechanism in the groove section, and brought into a closed state due to expansion of the inadhesive section of the valve mechanism due to injection of a pressurizing medium.

(Mode 5)

The microchip controlling system of Mode 4. wherein the inadhesive section of the valve mechanism is communicated with a side path section for injection of the pressurizing medium.

(Mode 6)

The microchip controlling system of Mode 5, wherein a partial section of the side path section is formed due to injection of the pressurizing medium in a manner where an elastic sheet of the microchip is shoved into a groove section provided on the microchip.

(Mode 7)

A microchip controlling method for a microchip controlling system comprising a microchip and a microchip controlling apparatus, wherein a microchip which is configured by adhesion of an elastic sheet and a plate/sheet member, and on which a flow path is provided as an inadhesive section between the elastic sheet and the plate/sheet member; and the microchip controlling apparatus comprises a valve mechanism, the valve mechanism is inflated or deflated so as to control the flow path to be opened or closed.

(Mode 8)

The microchip controlling method of Mode 7, wherein the valve mechanism are configured with at least two plates and the elastic sheets sandwiched by the plates, a first plate has a cut out section at a position corresponding to the flow path, a second plate has a groove section at a position corresponding to the cut out section, the flow path is controlled to be an opened state in a manner where the elastic sheet of the microchip enters the cut out section, and the flow path is controlled to be a closed state in a manner where the elastic sheet is shoved into the cut out section due to expansion of the groove section by injection of a pressurizing medium and the elastic sheet of the microchip is pushed out from the cut out section.

(Mode 9)

The microchip controlling method of Mode 7, wherein the valve mechanism comprises a plate having a groove section at a position directed to the flow path, the flow path is controlled to be an opened state in a manner where an elastic sheet of the microchip enters the groove section, and the flow path is controlled to be a closed state in a manner where the elastic sheet of the microchip is pushed out from the groove section due to injection of a pressurizing medium.

(Mode 10)

The microchip controlling method of Mode 7, wherein
the valve mechanism comprises two elastic sheets having an inadhesive section at a position directed to the flow path and a plate having a groove section provided to cover the inadhesive section, and
the flow path is controlled to be an opened state in a manner where an elastic sheet of the microchip squashes the inadhesive section of the valve mechanism in the groove section, and the flow path is controlled to be a closed state in a manner where the inadhesive section of the valve mechanism is expanded by injection of a pressurizing medium.

(Mode 11)

The microchip controlling method of Mode 10, wherein
the pressurizing medium is injected into the inadhesive section of the valve mechanism via a side path section.

(Mode 12)

The microchip controlling method of Mode 10, wherein
the elastic sheet of the microchip is shoved into the groove section on the microchip by injection of the pressurizing medium so as to form a partial section of the side path section.

(Mode 13)

A microchip according to any one of Modes 1 to 6.

(Mode 14)

A microchip controlling apparatus according to any one of Modes 1 to 6.

The disclosure of the Patent Literature above is incorporated in the present application by reference thereto. The exemplary embodiments or examples may be modified or adjusted within the scope of the entire disclosure of the present invention, inclusive of claims, based on the fundamental technical concept of the invention. In addition, a variety of combinations or selection of elements disclosed herein, inclusive each element in each claim, each element in each exemplary embodiment or example, each element in each drawing etc., may be made within the context of entire disclosure of the present inventions. That is, the present invention may cover a wide variety of modifications or corrections that may be made by those skilled in the art in accordance with the entire disclosure of the present invention, inclusive of claims, and the technical concept of the present invention.

REFERENCE SIGNS LIST 1 microchip controlling system
10 microchip controlling apparatus
11 base member
12 hinge
13 lid
14 pressurizing hole
20 valve mechanism
21, 23 resin plate of valve mechanism
22, 29 elastic sheet of valve mechanism
24 cut out section
25 groove section of valve mechanism
26 hole part
27 valve part
28 side path section
31 power supplying part
32 solenoid valve
33 pressure accumulator
34 controller
35 display part
100 microchip
101, 102 elastic sheet of microchip
103 resin plate of microchip
104 through hole
105 groove section of microchip
110 flow path
120 reaction chamber

The invention claimed is:

1. A microchip controlling system, comprising:
a microchip configured by adhesion of an elastic sheet and a plate/sheet member, and on which a flow path is provided as an inadhesive section between the elastic sheet and the plate/sheet member; and
a microchip controlling apparatus comprising a valve mechanism which is configured to be inflated or deflated so as to control the flow path to be opened or closed, wherein
the valve mechanism is configured with at least two plates and an elastic sheet sandwiched by the plates, the at least two plates including a first plate and a second plate,
the first plate has a cut out section at a position to be directed to the flow path,
the second plate has a groove section at a position corresponding to the cut out section,
the flow path is brought into an opened state when the elastic sheet of the microchip enters the cut out section,
the flow path is configured to be brought into a closed state when the elastic sheet of the valve mechanism is shoved into the cut out section due to expansion of the groove section by injection of a pressurizing medium and is configured to push out the elastic sheet of the microchip from the cut out section.

2. A microchip controlling system, comprising:
a microchip which is configured by adhesion of an elastic sheet and a plate/sheet member, and on which a flow path is provided as an inadhesive section between the elastic sheet and the plate/sheet member; and
a microchip controlling apparatus comprising a valve mechanism which is configured to be inflated or deflated so as to control the flow path to be opened or closed, wherein
the valve mechanism comprises two elastic sheets having an inadhesive section at a position to be directed to the flow path and a plate having a groove section provided to cover the inadhesive section,
the flow path is configured to be brought into an opened state when an elastic sheet of the microchip squashes the inadhesive section of the valve mechanism in the groove section, and is configured to be brought into a closed state due to expansion of the inadhesive section of the valve mechanism due to injection of a pressurizing medium,
the inadhesive section of the valve mechanism is communicated with a side path section for injection of the pressurizing medium, and
a partial section of the side path section is formed due to injection of the pressurizing medium in a manner where an elastic sheet of the microchip is shoved into a groove section provided on the microchip.

* * * * *